(12) United States Patent
Kitsunai et al.

(10) Patent No.: US 6,186,153 B1
(45) Date of Patent: Feb. 13, 2001

(54) PLASMA TREATMENT METHOD AND MANUFACTURING METHOD OF SEMICONDUCTOR DEVICE

(75) Inventors: Hiroyuki Kitsunai, Chiyoda-machi; Nobuo Tsumaki, Ushiku; Shigeru Kakuta, Yokohama; Kazuo Nojiri, Higashimurayama; Kazue Takahashi, Kudamatsu, all of (JP)

(73) Assignee: Hitachi, Ltd., Tokyo (JP)

( * ) Notice: Under 35 U.S.C. 154(b), the term of this patent shall be extended for 0 days.

(21) Appl. No.: 09/040,423

(22) Filed: Mar. 18, 1998

(30) Foreign Application Priority Data

Mar. 19, 1997 (JP) ................................................ 9-066099

(51) Int. Cl.$^7$ ............................................................. C25F 7/00
(52) U.S. Cl. ............................ 134/1.1; 134/22.1; 216/37; 216/67; 438/905
(58) Field of Search ................ 134/1.1, 1.2; 438/905; 118/70; 427/444; 117/97; 422/178

(56) References Cited

U.S. PATENT DOCUMENTS

| | | | |
|---|---|---|---|
| 5,085,727 | * | 2/1992 | Steger ................................. 156/345 |
| 5,108,542 | * | 4/1992 | Lin ....................................... 438/720 |
| 5,110,408 | * | 5/1992 | Fujii et al. ............................. 216/75 |
| 5,129,958 | * | 7/1992 | Nagashima et al. ................. 134/22.1 |
| 5,486,235 | * | 1/1996 | Ye et al. ................................ 134/1.1 |
| 5,639,341 | * | 6/1997 | Tabara .................................. 438/710 |
| 5,716,494 | * | 2/1998 | Imai et al. ............................ 438/700 |
| 5,756,400 | * | 5/1998 | Ye et al. ............................... 438/710 |
| 5,817,578 | * | 10/1998 | Ogawa ................................. 438/714 |
| 5,843,239 | * | 12/1998 | Shrotriya .............................. 134/1.1 |

FOREIGN PATENT DOCUMENTS

| | | | |
|---|---|---|---|
| 3-62550 | * | 3/1991 | (JP) . |
| 6349786 | * | 6/1993 | (JP) ............................. H01L/21/302 |
| 7-508313 | * | 9/1995 | (JP) . |
| 9-66099 | * | 3/1997 | (JP) . |

* cited by examiner

*Primary Examiner*—Randy Gulakowski
*Assistant Examiner*—Allan Olsen
(74) *Attorney, Agent, or Firm*—Antonelli, Terry, Stout & Kraus, LLP.

(57) ABSTRACT

Providing a dry cleaning method capable of removing deposition films which adhere to the inner walls of a semiconductor manufacturing apparatus-that is, removing dust production sources therefrom. To this end, the dry cleaning process is supplemented by a step of removing either ion sputtered matter or products of the internal member materials of the apparatus or chemical compounds of such apparatus internal member materials and of an etching gas, in addition to a step of removing etching reaction products. It thus becomes possible to eliminate dust generation due to pealing off of deposition films with an increase in the number of wafers being processed, which in turn increases the manufacturing yield and working efficiency of the manufacturing apparatus.

16 Claims, 4 Drawing Sheets

PLASMA TREATMENT METHOD AND MANUFACTURING METHOD OF SEMICONDUCTOR DEVICE

BACKGROUND OF THE INVENTION

The present invention relates a method for dry cleaning the interior of a semiconductor manufacturing apparatus for use in performing microfabrication or film formation on substrates during the manufacturing processes of semiconductor devices. In addition, the invention also relates to a method for manufacturing semiconductor devices by use of a semiconductor manufacturing apparatus having its inside cleaned.

In processes for the manufacture of semiconductor devices, the attachment or adhesion of dust (contaminants) to substrates under manufacture causes pattern defects in the target devices, which in turn reduces the production yield during the manufacturing processes.

In currently available manufacturing processes, some processes are becoming more important, including dry etching technology using plasma, chemical vapor deposition (CVD) and the like. More specifically, such processes are designed to perform microfabrication, such as film formation, etching and the like, by utilizing plasma reaction of various kinds of gases introduced into the apparatus. During execution of these processes, deposition films tend to be left on and to adhere to the inner walls of the manufacturing apparatus being used, as the target substrate is being subjected to such microfabrication. One example is in dry etching, wherein certain deposition films adhere to the inner walls of the apparatus due to decomposition or combination of etching gases within a plasma and also due to generation of secondary etching products during etching. As wafers to be processed increase in number causing the film thickness to increase accordingly, such deposition films badly behave in that they partly peel off and then act as dust or contaminants which cause pattern defects in the devices being manufactured. Accordingly, it is necessary for such adhesion deposits to be removed periodically.

Conventionally, one typical approach to removal of such adhesion deposits is the so-called wet cleaning technology—i.e. wiping out the equipment by using a catalytic substance, such as alcohol or pure water or the like, while allowing the apparatus to be exposed to the atmosphere. Another prior known approach is a dry cleaning scheme using a combination of chlorine-based gas and fluorine-based gas, as disclosed, for example, in Published Unexamined Japanese Patent Application (PUJPA) No. 3-62520. A further approach is a dry cleaning technique using a plasma formed of a mixture of oxygen gas, and chlorine gas as disclosed for example in PUJPA No. 7-508313.

Unfortunately, the above-mentioned approaches have encountered serious problems as now will be discussed First, with regard to the wet cleaning approach, it has been required that the apparatus be disassembled every time it is exposed to the atmosphere at constant time intervals; in addition thereto, the vacuum evacuation procedure is required after completion of every wet cleaning process. Obviously, this would result in termination of the operation of the apparatus for an increased time duration every time the cleaning treatment is done, which in turn leads to a noticeable decrease in working efficiency of the apparatus while reducing the throughput thereof.

Second, regarding the approach disclosed in PUJPA No. 3-62520, the material to be etched is an alloy containing therein Al and W, and therefore the technique disclosed therein is featured in that the cleaning steps for a plurality of etching objects are combined together in order to remove away Al's etching products as well as W's etching products. The third approach employing the dry cleaning technique as taught by PUJPA No. 7-508313 is featured by removing what is called the reaction products which originated from chemical reaction between the to-be-etched material and an etching gas being used or between a photoresist (carbon) employed as a mask layer material for etching and the etching gas or still alternatively due to polymeric bodies of the etching gas.

These approaches are completely silent about the cleaning of either ion sputtered matter or the "residue" of the materials of internal members of the apparatus or chemical compounds of the apparatus internal member materials and the etching gas being used, although these documents involve teachings as to how to clean up certain products resulting from chemical reaction between the etching gas and those materials left on wafer substrates, such as to-be-etched materials, mask materials and the like.

In the etching apparatus, a plasma created by the etching gas attempts to etch the substrate surface and simultaneously sputter the apparatus internal member materials also, which might result in attachment and adhesion of certain materials onto the inner walls of the apparatus, which materials may include, in addition to etching reaction products, either ion-sputtered matter of such apparatus internal member materials or chemical compounds of the apparatus internal member materials and of the etching gas being employed.

In other words, the dry cleaning methodology proposed to date is faced with a serious problem left unsolved: it is not possible to fully remove the ion sputtered matter or products of the apparatus internal member materials or the chemical compounds of such apparatus materials and the etching gas, which results in generation of contaminants due to delamination of resultant non-removed materials left on the inner walls of the apparatus.

SUMMARY OF THE INVENTION

It is therefore an object of the present invention to avoid the problems associated with the prior art, and also to provide a dry cleaning method which is capable of effectively removing any deposition films left adhered on the inner walls of the manufacturing apparatus, and more specifically, to a dry cleaning method which is capable of successfully removing any possible dust production sources.

The foregoing object is attainable by providing a specific dry etching process which includes the steps of removing etching reaction products, and removing either ion sputtered constituents of those materials of the internal structure members of the manufacturing apparatus or chemical compounds of such apparatus materials and the etching gas being used.

The foregoing object may also be attained by providing a dry cleaning process which makes use of a chosen gas that contains therein a material having an interatomic bonding energy, with respect to elements constituting a gas for use during an etching and a cleaning step, which is greater in value than the atomic bonding energy between elements constituting a material to be etched and elements constituting a gas or gases used during the etching and cleaning processes.

The object of the invention is also attained by employing for the dry cleaning process a specific kind of gas which contains therein a material that has its interatomic bonding energy with respect to elements constituting gases for use in the etching and cleaning steps, which energy is greater in value than the interatomic bonding energy between elements constituting the apparatus internal member materials and those elements constituting gases used in the etching and cleaning processes.

These and other objects, features and advantages of the invention will be apparent from the following more particular description of preferred embodiments of the invention, as illustrated in the accompanying drawings.

DETAILED DESCRIPTION OF PREFERRED EMBODIMENTS

Some preferred embodiments of the dry cleaning methodology of the present invention will be explained in detail with reference to the accompanying drawings.

Figure 1:
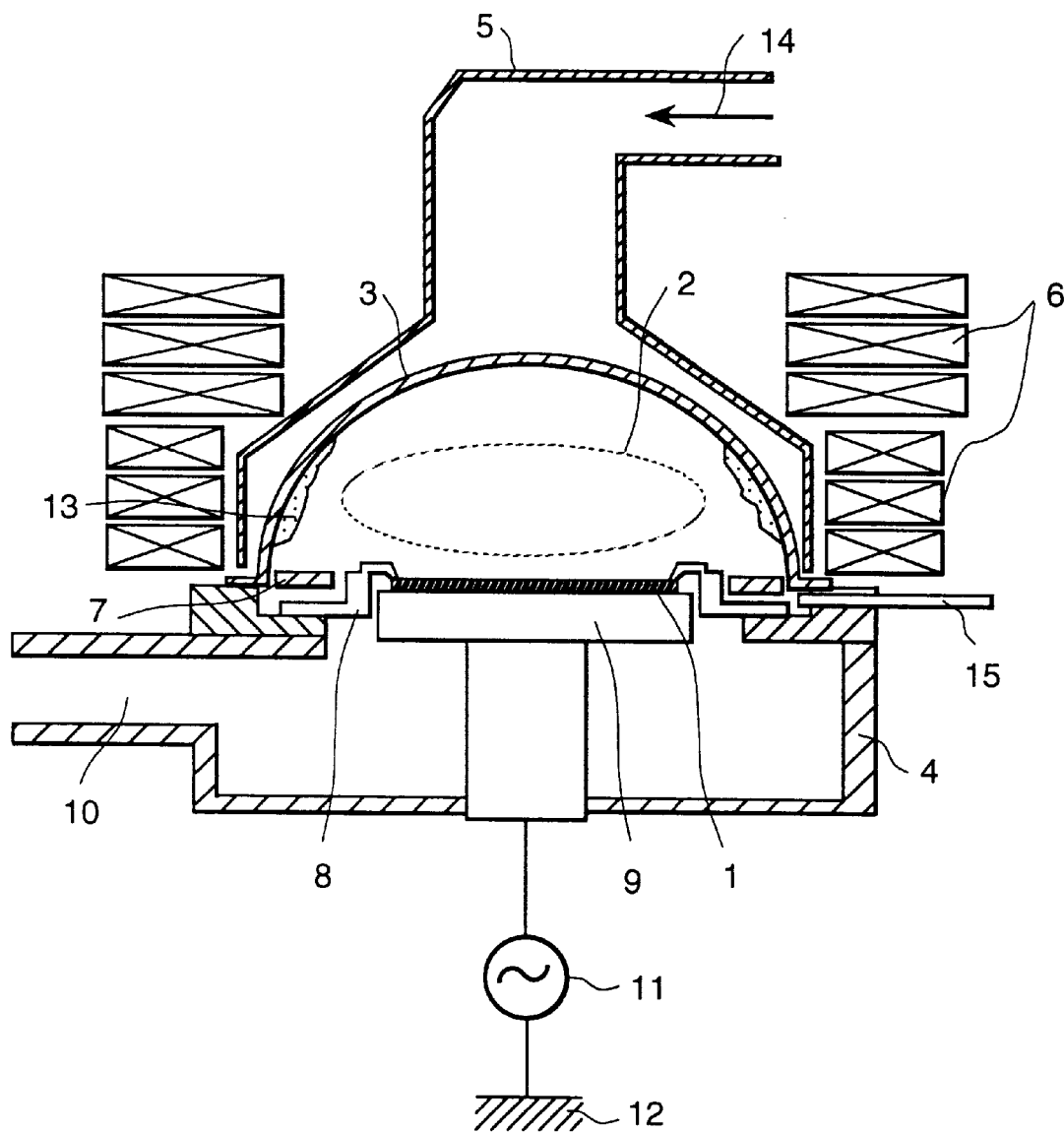
FIG. 1 is a diagram showing a semiconductor manufacturing apparatus incorporating the principles of the present invention.

FIG. 1 illustrates the configuration of a microwave etching apparatus adapted for use in performing the dry cleaning method in accordance with the present invention. In this drawing, reference numeral 1 designates a silicon wafer (substrate) to be subjected to microfabrication; and a quartz bell jar 3 and a main chamber 4 are provided to form a chamber for establishment of the vacuum environment required exhaust port 10 is provided for vacuum evacuation of the chamber, whereas a gas introduction section 15 is provided for introduction of a gas or gases used in etching or dry cleaning. A substrate stage 9 provides rigid support of a wafer under manufacture; and a clamper 8 is used for clamping the wafer on the substrate stage 9. This damper may typically be made of ceramics including, but not limited to, alumina ceramics. In the alternative, an electrostatic suction force may be used to rigidly support the wafer on the substrate stage 9. An Earth plate 7 is provided at the chamber periphery; and a high-frequency power supply 11 is provided for application of a radiofrequency (RF) bias voltage between the Earth plate 7 and wafer stage 9.

The microwave etching apparatus is first subject to introduction of a chosen gas for use in generating a plasma after completion of high vacuum evacuation. Then, microwaves 14, excited by a magnetron (not shown), are then introduced via the waveguide 5 into the quartz bell jar 3 (processing space) causing a gas in the processing space to transform into a plasma by electronic cyclotron resonance (ECR) with a magnetic field created by a solenoid 6 disposed around the processing space, which plasma is used to effectuate an intended etching treatment. A RF bias voltage is applied by the high-frequency power supply 11 between the Earth plate 7 and wafer stage 9 for the purpose of performing an anisotropic etching by attraction of ions thereto.

At this time certain reaction products formed as secondary products of the etching process can become attached to and stack onto the constituent components of the processing space, such as the quartz bell jar 3, the main chamber 4, the exit 15 of the gas introduction section, the clamper 8 and other elements, which could result in formation of more than one deposition film 13. As wafers under processing increase in number allowing such a deposition film 13 to likewise increase in thickness, film eventually reaches a state where it tends to peel off from the inner walls and enter the atmosphere of the process space behaving as dust or contaminants which can cause pattern defects in devices being manufactured.

Figure 2A:
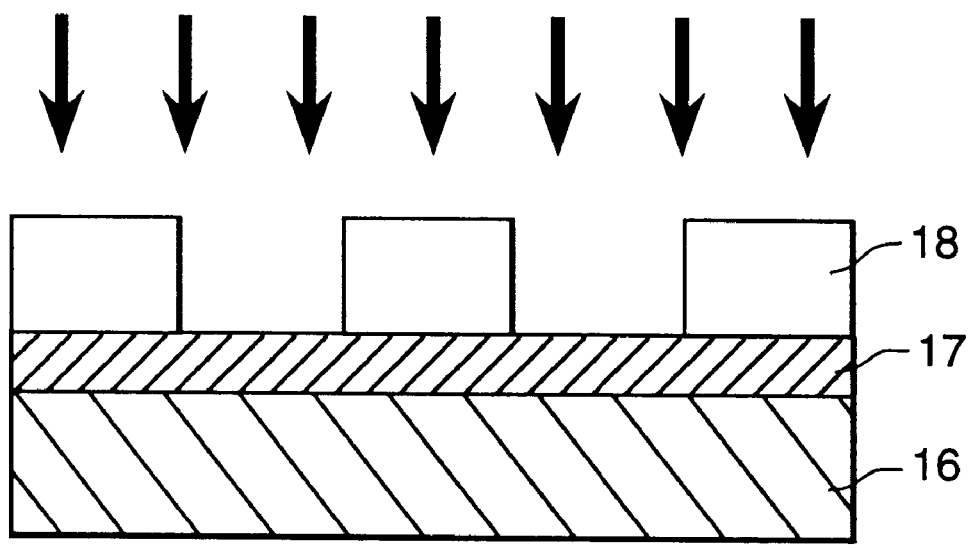
FIG. 2A and 2B are diagrams illustrating, in cross-section, two major steps in the manufacture of a semiconductor wafer in accordance with a first embodiment of the invention.
Figure 2B:
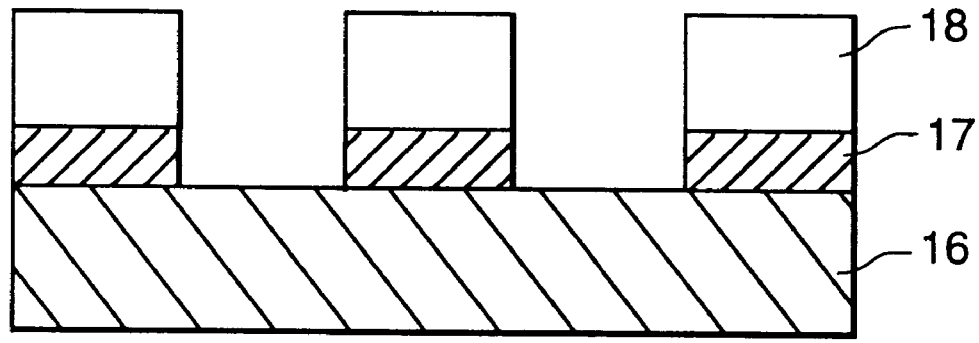

Suppose, for example, that a silicon oxide film ($SiO_2$) 17 for use as a dielectric film shown in FIG. 2 (FIG. 2A and 2B) is etched using a plasma of fluorocarbon-based gas—here, $CF_4$ gas—and a plasma of additive gases of Ar and $O_2$. As shown in the drawing, the $SiO_2$ film 17 is formed on a substrate 16 by way of example, and a mask pattern 18 made of a chosen photoresist material is further formed thereon allowing the resulting structure to be subject to an etching treatment by use of the etching apparatus shown in FIG. 1. At this time, the etching gas attempts to dissociate in the plasma hitting the target wafer so that the etching progresses accordingly. When this is done, any unnecessary deposits which adhere to the inner walls of the apparatus, with the to-be-etched object being as the cause thereof, may be oxides containing an silicon and chemical compounds containing organic substance.

Incidentally, the gas used for dry cleaning have the purpose of creating chemical compounds of increased vapor pressure by reaction with the deposits to be removed, which will finally be removed through vaporization and vacuum evacuation. Assuming for instance that the deposits are carbon compounds, a plasma of $O_2$ gas is applied thereto permitting vaporization thereof to CO or $CO_2$ gases for removal. To do this, the approach as taught by PUJPA No. 7-508313 is designed to employ a cleaning gas consisting of a mixture of a chlorine-based gas and an oxygen-based gas. Mixing oxygen therein to may improve the efficiency as a whole by disconnecting or separating carbon from chemical compounds containing therein metal and chlorine, as well as an organic substance, while cleaning the metal by means of chlorine.

When etching the $SiO_2$ film 3 as used in this embodiment, cleaning is typically done using a mixture or combination of a fluorine-based gas and oxygen-based gas. However, as stated above, the plasma originated from the etching gas, in addition to etching the substrate surfaces 17, 18 to be etched, attempts to hit also the materials of the apparatus internal parts or components, such as for example the damper 8 and Earth plate 7, resulting in an increase in the amount of undesired secondary etching products devotable to creation of the deposition film 13, which products may include, in addition to the reaction products of the to-be-etched material, either the ion sputtered products of the apparatus internal component materials or chemical compounds of such apparatus materials and of the etching gas being used.

Typically, alumina components are employed in a plasma-applied semiconductor manufacturing apparatus, including an etching apparatus. In this embodiment (the example as shown in FIG. 1) unnecessary deposits stacked or adhered to the apparatus inner walls may be left in the form of organic compounds of the to-be-etched $SiO_2$ material and of resist material, which have originated from the to-be-etched object per se, and also in the form of alumina resulting from ion sputtering due to the fact that the damper 8 as one of the alumina components inside the apparatus is exposed to the plasma. Part of this may become attached and adhere in the form of aluminum fluoride by the reaction of fluorine during etching. The prior art dry cleaning architecture merely comes with a cleaning treatment with respect to limited materials, such as $SiO_2$ and organic compounds of resist materials. To be more specific, the prior art fails to take into consideration in any way the depositability of either sputtered products of the apparatus internal component materials or chemical compounds of such apparatus materials and etching gas; and obviously, the prior art does not take account of how a cleaning is to be done therefor. Accordingly, such deposits might be finally left as the cause for generation of contaminants.

According to the present invention, it becomes possible, by adding to the dry etching process both the step of removing etching reaction products and the step of removing any chemical compounds of the apparatus inside component materials and etching gas(es), to successfully remove also deposits made of such compounds of the apparatus internal component materials which have been long ignored in the conventional dry cleaning technology, which in turn leads to the ability to improve the cleaning effect, while simultaneously increasing the contaminant generation suppression effect.

The illustrative embodiment is specifically designed to add, as the apparatus inside material cleaning treatment, a cleaning step using a mixture gas of $BCl_3$ and $Cl_2$. Aluminum deposits may be effectively removed by production of $AlCl_3$ of high vapor pressure using a $Cl_2$ gas plasma. However, in cases where such aluminum is of an oxide or fluoride, the plasma of $Cl_2$ alone is incapable of producing $AlCl_3$ rendering it impossible to effectuate any intended removal during cleaning due to the fact that the interatomic bonding energy of Al—O and Al—F remains greater than the interatomic bonding energy of Al—Cl. In view of this, a specifically arranged gas containing therein B, such as a $BCl_3$ gas, which has a greater interatomic bonding energy with respect to fluorine and oxygen than the interatomic bonding energy of Al—O and Al—F, is mixed into the $Cl_2$ gas, thereby removing O and F out of Al—O and Al—F to thereby render effective the cleaning by $Cl_2$. This may in turn enable achievement of successful removal of ion sputtered products of the apparatus internal component materials along with removal of inherent etching reaction products.

Here, sequential execution of a cleaning operation using $O_2$ and sulphur hexafluoride ($SF_6$) and a cleaning operation using a mixture gas of $BCl_3$ and $Cl_2$ may remarkably increase the cleaning effect inside the apparatus and also the contaminant suppression effect therein.

In the way discussed above, the cleaning effect within the apparatus may be improved dramatically by performing the dry cleaning process for removal of ion sputtered products of the apparatus internal member materials, or any chemical compounds of such apparatus materials and an etching gas, in addition to the dry cleaning for removal of reactive products with respect to the to-be-etched material. While in this embodiment the dry cleaning for such etching reaction products and the cleaning with respect to the apparatus internal member materials are done sequentially, the two cleaning gases also may be mixed together.

Figure 3A:
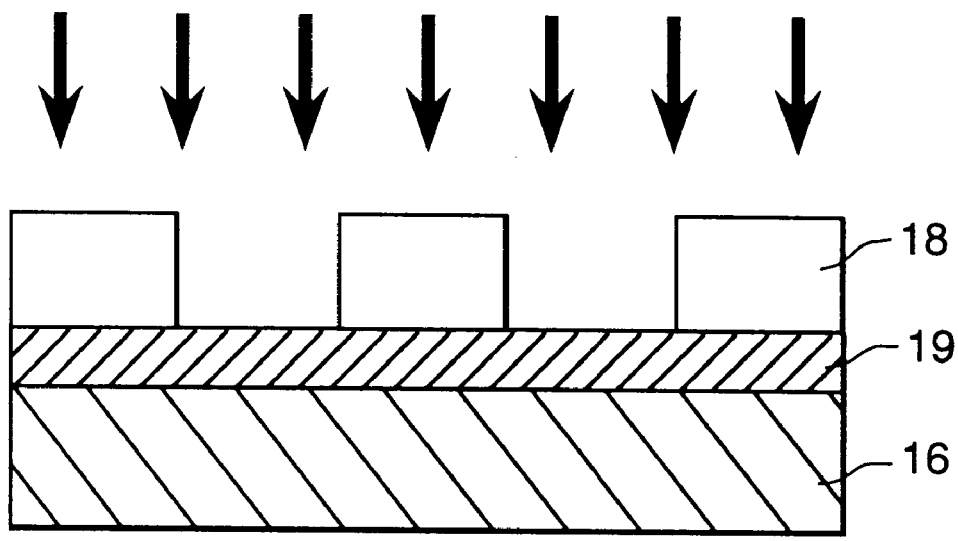
FIG. 3A and 3B are diagrams depicting in cross-section two major steps in the manufacture of a semiconductor wafer in accordance with a second embodiment of the invention.
Figure 3B:
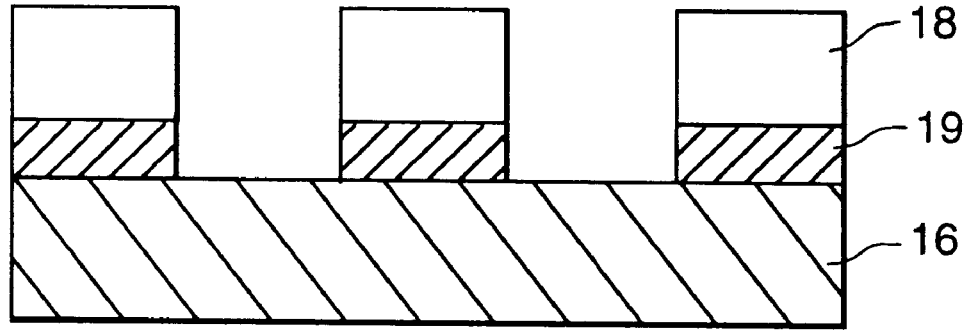

Next, another embodiment applying the principles of the present invention to tungsten lead wires will be explained in conjunction with (FIG. 3A and FIG. 3B). As shown in the drawing, a tungsten lead wire layer 19 is formed on the substrate 16 while a mask pattern 18 made of a chosen photoresistive material is formed thereon; and the resulting structure is then subject to an etching process in the etching apparatus shown in FIG. 1. For tungsten, a plasma of $SF_6$ gas is used to facilitate progression of an etching required.

During the above process, any unnecessary deposits can be left on to the apparatus inner walls in the form of chemical compounds containing therein tungsten, fluorine and an organic substance, and further an aluminum oxide as an ion-sputtered material produced from the clamper 8 that is one of the alumina components inside the apparatus, as it is being exposed to the plasma. Part of this is in the form of aluminum fluoride due to the plasma of $SF_6$ gas during etching. Here, both the cleaning using $SF_6$ and the cleaning using the mixed gas of $BCl_3$ and $Cl_2$ were done in a sequential manner. $SF_6$ may exhibit some cleaning effects with respect to tungsten and an organic substance also. The cleaning using the $BCl_3/Cl_2$ gas exhibits cleaning effects with respect to aluminum oxide and aluminum fluoride as has been explained in conjunction with the first embodiment. This cleaning is advantageous in extremely improving the contaminant suppression effect. As in the first embodiment, the cleaning effect may be noticeably enhanced by performing both a dry cleaning process for removal of reaction products with respect to the etching material and also a dry cleaning process with respect to the apparatus internal member materials.

Figure 4A:
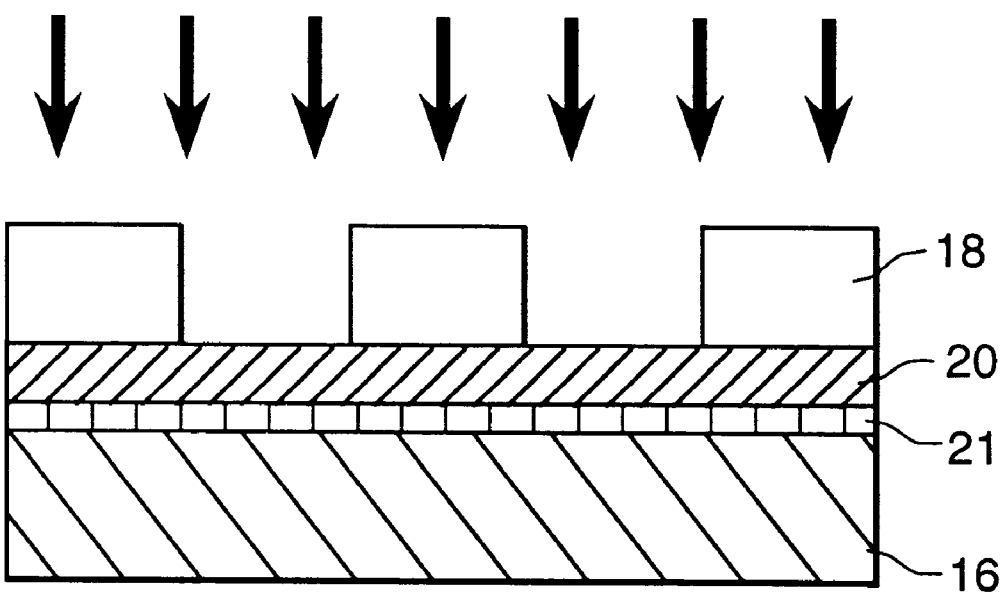
FIG. 4A and 4B are diagrams showing in cross-section two major steps in the manufacture of a semiconductor wafer in accordance with a third embodiment of the invention.
Figure 4B:
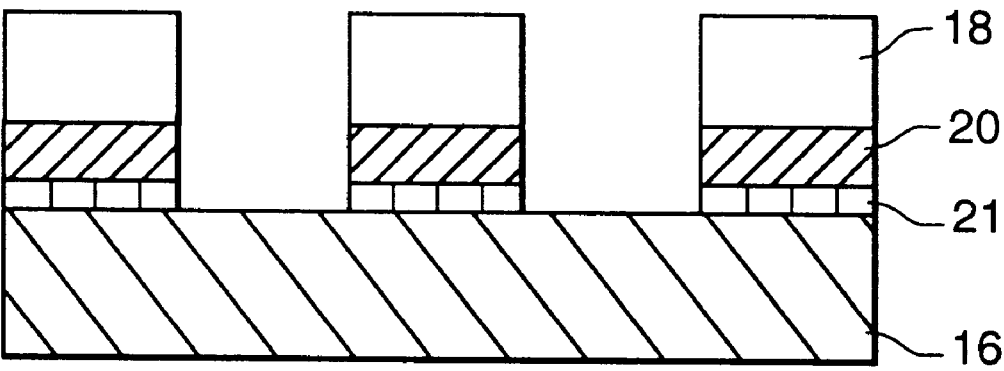

An explanation will now be given of a further embodiment incorporating the principles of the present invention. Here, an exemplary case will be discussed wherein the present invention is applied to the case of etching aluminum lead wires as shown in FIG. 4A and FIG. 4B.

Recently, most metal lead wires come with a laminated structure having a barrier metal layer 21 associated therewith as depicted in the drawing rather than a single aluminum film structure, which permits use of a plurality of kinds of etching gases during the etching processes thereof. This is for achieving superior anti-electromigration characteristics and diffusion barrier characteristics. By way of example, reference will be made herein to the case of etching a lamination film structure consisting essentially of an aluminum lead-wire layer 20 and titanium-tungsten (TiW) barrier metal 21. As stated previously, etching is performed in a way such that a chosen chemical compound of high vapor pressure relative to the material to be etched is formed so as to allow the etching to progress. In this case the first layer 20 made of aluminum is etched by altering to $AlCl_3$ of high vapor pressure using a $Cl_2$ gas. When this is done, Al or $AlCl_x$ can be attached and adhered for deposition to the apparatus inner walls, including several structure components of the processing chamber, such as for example the quartz bell jar 1, main chamber 4, gas introduction port 15, and damper 8. Thereafter, the second layer of $TiW_2O$ is processed by a $SF_6$ plasma; at this time, Ti or tungsten (W) might be stacked and adhered to the apparatus inner walls and/or the constituent components of the processing chamber thereof.

Typically, in cases of cleaning Al or $AlCl_x$ and of cleaning Ti, the $Cl_2$ plasma may be used for removal of deposits by altering them to $AlCl_3$ and TiCl of higher vapor pressure. In the case of cleaning W, a plasma of fluoride gas, such as for example $SF_6$ plasma, is employable to remove the same by altering it to $WF_6$ of higher vapor pressure.

Unfortunately, in cases where the film for configuration of an intended lead wire pattern has a lamination film structure rather than a single film structure, resultant deposition films left adhered to the apparatus inner walls and the constituent components of the processing chamber are not of a simple form but are in the "complex" form of chemical compounds with such gases because of the use of a plasma of plural etching gases and also use of multiple cleaning gases.

More specifically, the possible additive deposits are:

1) Al or $AlCl_x$ is attached for deposition during etching of the first layer. The resultant deposits are altered by the $SF_6$ plasma to aluminum fluoride during the TiW etching of the second layer. Thereafter, $TiW_2O$ of the second layer is processed by $SF_6$ plasma, which would result in attachment and deposition of Ti or W onto the apparatus inner walls and the components of the processing chamber.

2) Al and $AlCl_x$ as deposited during etching of the first layer are further accelerated in production of aluminum fluoride during the $SF_6$ plasma cleaning process for removal of W, which is a deposit during the TiW etching of the second layer.

3) A plasma originated from the etching gas or cleaning gas attempts to hit the apparatus internal component materials, i.e. aluminum components as typically employed for the apparatus inside components, resulting in attachment and deposition of deposit onto the apparatus inner walls by ion sputtering action in the form of aluminum oxide.

4) The aluminum oxide left adhered to the apparatus inner walls by such plasma's ion sputtering action is then altered in part to aluminum fluoride by the $SF_6$ plasma during the TiW etching of the second layer.

5) The aluminum oxide left adhered to the apparatus inner walls due to the plasma's ion sputtering action is partly altered to aluminum fluoride due to $SF_6$ plasma during W cleaning.

In the way discussed above, where a multi-layered lead wire is to be etched, certain plasma of an etching gas behaves during subsequent etching of one lead wire layer, to alter certain deposits, previously formed on the apparatus inner walls during prior etching of another lead wire layer, into specific chemical compounds hard to be removed. Furthermore, during cleaning of deposits of a certain element, the plasma of a cleaning gas used herein attempts to alter those deposits of another element to compounds which are hard to remove. These can disadvantageously serve to provide a bar to accomplishment of a desired cleaning performance.

Moreover, the plasma of etching gas and that of the cleaning gas will possibly hit the apparatus inside materials also, which results in attachment of ion sputtered products of such apparatus materials to inside of the apparatus. These may also become chemical compounds with the etching gas and cleaning gas. These can raise a serious bar to achievement of an intended cleaning in both performance and reliability.

According to the present invention, the dry cleaning process is specifically supplemented by a cleaning step using a specific gas containing therein a chosen material having an interatomic bonding energy with the etching gas elements, which energy is greater in value than the interatomic energy between the element(s) constituting the to-be-etched object and those constituting the etching gas. This makes it possible to successfully remove any unnecessary deposits as discussed at Paragraph 1). Specifically, it becomes possible to remove away those aluminum fluorides which are altered by $SF_6$ plasma during the TiW etching of the second layer from Al as deposited during etching of the first layer.

Another advantage of the invention lies in the capability of removing the deposits discussed supra at Paragraph 3) because of the fact that the step of removing ion sputtered products of the apparatus internal member materials is added along with the step of removing etching reaction products. This in turn makes it possible to remove any ion sputtered products of aluminum components used as internal parts or components of the etching apparatus being employed.

Furthermore, the dry cleaning process is specifically arranged to include a cleaning step using a specific gas containing therein a material having the interatomic bonding energy with the gas elements of the cleaning step, which energy is greater in value than the interatomic bonding energy between inherent materials, including the to-be-etched material and the apparatus component materials, and the elements constituting the cleaning gases at other steps. This may advantageously serve to enable successful removal of those deposits of the kinds as discussed at Paragraphs 2), 4) and 5). In other words, it becomes possible to remove any deposits which have become aluminum fluoride due to the $SF_6$ plasma during the W cleaning.

More practically, use of $Cl_2$ plasma alone is not able to remove by cleaning the aluminum fluoride which has been created by alteration of aluminum to fluoride due to the $SF_6$ plasma as used during the etching and cleaning. Arranging the dry cleaning process so as to employ as the cleaning gas a mixture of $Cl_2$ and $BCl_3$ added thereto—the latter is a chosen gas containing therein the material B having an interatomic bonding energy with fluorine which is greater in value than the interatomic bonding energy between fluorine for use in etching and cleaning and aluminum used as the to-be-etched material—may enable separation of F from Al—F, which in turn renders effective the cleaning using $Cl_2$.

Boron is such that the interatomic bonding energy of B—O is greater than that of aluminum oxide Al—O which is the ion sputtered products of the apparatus internal member material(s). Accordingly, mixing a B-containing gas, such a $BCl_3$ into $Cl_2$ gas enables separation of O from Al—O, rendering more effective the cleaning by $Cl_2$. This makes it possible to remove any ion sputtered products of the apparatus internal member materials also.

The aforesaid cleaning process for certain of the films deposited by reaction with the etching and cleaning gases at the next step as required due to the multilayer lamination film structure may be performed before and/or after the cleaning process for etching reaction products alone.

It must be noted that although the illustrative embodiments of the invention have been described based on specific examples directed to use of the microwave etching apparatus, the invention should not exclusively be limited thereto and may alternatively be modifiable for use in other applications with etching apparatus of any type as far as it is designed to employ a plasma to clean out deposits on the apparatus inner walls, including but not limited to parallel-flat plate type etching apparatus, induction-coupled etching apparatus, or CVD apparatus, while offering similar technical advantages as discussed previously.

As has been described above, according to the present invention, it becomes possible to effectively remove any deposition films left adhered to the inner walls of the manufacturing apparatus employed. This makes it possible to eliminate peel-off or abruption of such deposition films due to an increase in thickness thereof (increase in processing number) and also dust production as originated therefrom, which in turn enables improvement of the production yield during the manufacturing processes while simultaneously increasing the working efficiency of the manufacturing apparatus being used.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A dry cleaning method for use in a plasma etching apparatus for etching using a plasma of a plurality of gases, comprising the steps of:

performing a first cleaning treatment using a plasma of a first cleaning gas, to remove reactive product materials containing therein at least one residual etched material created during said etching and attached to inner walls of the apparatus and/or internal components of said apparatus; and performing a second cleaning treatment using a plasma of a second cleaning gas, to remove chemical components which are reaction products of a reaction between (a) residual etched material attached to the inner walls of the apparatus and/or to the internal components thereof and (b) the first cleaning gas, said second cleaning gas containing therein a material that forms bonds with constituent elements of said chemical components, wherein said bonds have a greater bond energy than that of bonds within said reaction products of the reaction between said residual etched material and said first cleaning gas.

2. The method of claims 1, wherein said etching is an etching of a semiconductor wafer having thereon a multilayer structure of at least two layers of different materials, and wherein the reactive product materials removed during the first cleaning treatment are materials formed in etching said multilayer structure.

3. The method of claim 1, wherein said chemical components include aluminum flouride.

4. A dry cleaning method for use in a plasma etching apparatus for etching using a plasma of a plurality of gases, comprising the steps of:

performing a first cleaning treatment using a plasma of a first cleaning gas to remove reactive product materials created through the etching and attached to inner walls of the apparatus and/or internal components of the apparatus, leaving residual attached materials from said first cleaning treatment, said etching being an etching procedure to etch a semiconductor wafer having a multilayer structure of layers of different materials; and performing a second cleaning treatment using a plasma of a second cleaning gas to remove the residual attached materials, said second cleaning gas containing therein a material that forms bonds with constituent elements of said residual attached materials, wherein said bonds have a greater bond energy than that of bonds within said residual attached materials.

5. The method of claim 4, wherein said residual attached materials include a material formed from material of the plasma etching apparatus and/or internal components thereof.

6. The method of claim 1, wherein the residual attached materials include aluminum fluoride.

7. The method of claim 1, wherein said reactive product materials include materials formed from each layer of said multilayer structure.

8. The method of claims 1 or 4, wherein the first and second cleaning treatments are performed after a preselected number of wafers have been etched in the plasma etching apparatus.

9. The method of claims 1 or 4, wherein the first and second cleaning gases are different from each other.

10. The method of according to claims 1 or 4, wherein the first cleaning gas includes a fluorine-containing compound, and the second cleaning gas includes a boron-containing gas.

11. The method of claim 10, wherein the reactive product materials include aluminum-containing materials.

12. The method of claim 11, wherein the second cleaning gas includes a mixture of $BCl_3$ and $Cl_2$.

13. The method of claim 12, wherein the first cleaning gas includes $SF_6$.

14. The method of claim 3 or 6, wherein the second cleaning gas includes a boron-containing gas.

15. In a semiconductor device manufacturing method, performing the dry cleaning method set forth in claim 1 or 4 to clean inside of said plasma etching apparatus, thereby providing a cleaned plasma etching apparatus, and thereafter performing etching treatment of a semiconductor wafer surface by using said cleaned plasma etching apparatus.

16. A semiconductor device manufactured by the semiconductor device manufacturing method recited in claim 15.

* * * * *